United States Patent [19]

Mahler

[11] 4,338,883

[45] Jul. 13, 1982

[54] VACUUM VAPOR-DEPOSITION INSTALLATION WITH A VACUUM CHAMBER, A VAPORIZING CHAMBER AND AN EVAPORIZING CHAMBER

[75] Inventor: Peter Mahler, Obertshausen, Fed. Rep. of Germany

[73] Assignee: Leybold-Heraeus GmbH, Cologne, Fed. Rep. of Germany

[21] Appl. No.: 181,456

[22] Filed: Aug. 25, 1980

[30] Foreign Application Priority Data

Oct. 3, 1979 [DE] Fed. Rep. of Germany ....... 2940064

[51] Int. Cl.$^3$ ............................................ C23C 13/08

[52] U.S. Cl. .................................... 118/719; 118/727; 118/729; 118/733

[58] Field of Search ............... 118/733, 715, 731, 727, 118/730, 719, 726, 729; 427/42, 255.5, 248.1; 219/121 EF, 121 EE, 121 EL, 121 EN

[56] References Cited

U.S. PATENT DOCUMENTS 3,206,322 9/1965 Morgan ........................... 118/504 X
3,524,426 8/1970 Ogle, Jr. et al. ................ 118/733 X
3,641,973 2/1972 Shrader ............................... 118/719
3,656,454 4/1972 Shrader ........................... 118/719 X
3,921,572 11/1975 Brunner et al. ..................... 118/730

FOREIGN PATENT DOCUMENTS 2330710 1/1975 Fed. Rep. of Germany ...... 118/730

*Primary Examiner*—John D. Smith
*Assistant Examiner*—Bernard F. Plantz
*Attorney, Agent, or Firm*—Felfe & Lynch

[57] ABSTRACT

A vacuum vapor-deposition installation for batchwise operation has a horizontal valve chamber which is arranged in the middle and on which are fitted, by way of suitable openings, a top vaporizing chamber and a lower evaporizing chamber. The two openings are aligned with each other and can be sealed simultaneously in a vacuum-tight manner by a two-way valve movable horizontally in the valve chamber. For the purpose of charging the vaporizing chamber with substrates, this chamber can be lifted from the valve chamber. To solve the problem of increasing the number of production cycles per unit of time, the interior of the evaporizing chamber is accessible from the exterior without interrupting the vacuum in the valve chamber. This measure renders it unnecessary to charge the evaporizer in the evaporizing chamber through the valve chamber, for which purpose the entire chamber would have to admit air.

4 Claims, 1 Drawing Figure

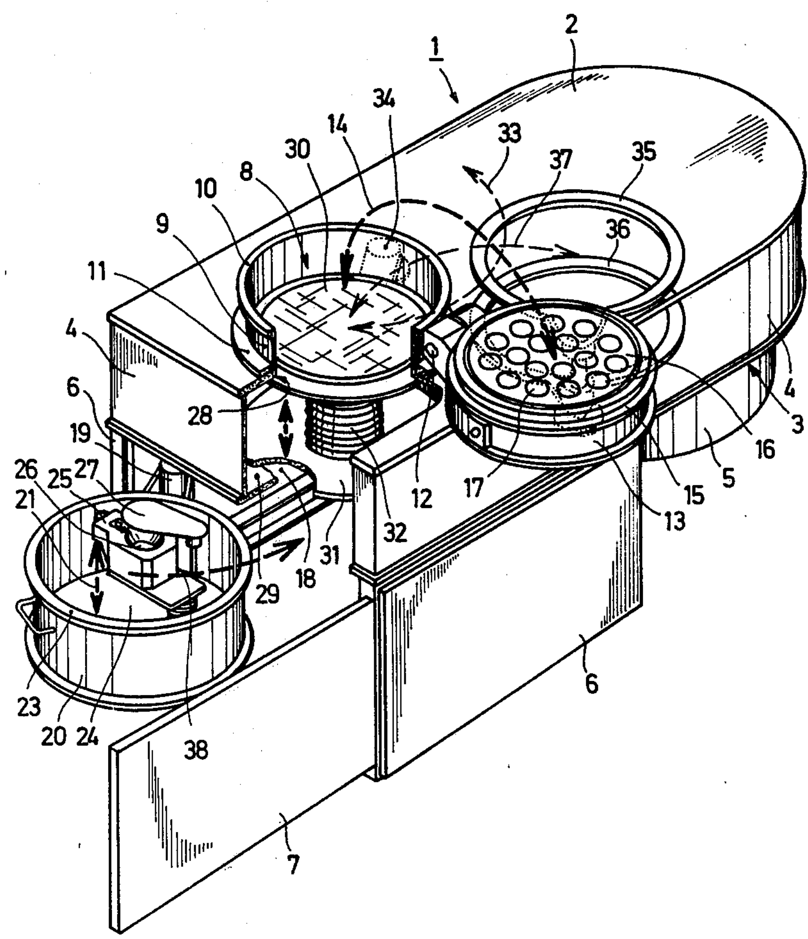
1
2
34
14
30
8
10
9
11
4
6
19
26
25
27
21
23
20
24
38
28
29
18
31
32
12
17
13
15
5
16
3
4
33
37
35
36
6
7

VACUUM VAPOR-DEPOSITION INSTALLATION WITH A VACUUM CHAMBER, A VAPORIZING CHAMBER AND AN EVAPORIZING CHAMBER

BACKGROUND OF THE INVENTION

The present invention relates to a vacuum vapour-deposition installation for batch-wise operation and having a valve chamber which has a suction opening for producing a vacuum, an upwardly directed first opening for vacuum-tight connection with a removable vaporizing chamber and a downwardly directed second opening for connection with an evaporizing chamber. The first and the second openings are substantially in alignment and each is surrounded by a valve seat towards the valve chamber, the installation also having a two-way valve which is horizontally movable in the valve chamber, with the two valve discs of which being movable apart.

In a vapour-deposition installation of this kind, as disclosed in U.S. Pat. No. 3,206,322, two two-way valves of complicated construction are even provided, obviously because the expert had to proceed on the basis that the sealing action of the valves diminishes in the course of time because of the deposition of vapour on each of the two upper valve seats. Whereas in the known installation, the vaporizing chamber can be removed with the two-way valves closed, for the purpose of charging, without the vacuum being adversely affected on the other side of the two-way valves, this is not possible as regards the evaporizing chamber. However, the evaporizer arranged in the evaporizing chamber must likewise be provided with evaporizing material and possible cleaned, inspected and adjusted. In the known equipment this is possible only by way of the chambers for the two way valves, so that the vacuum in the entire installation must be interrupted. Thus, when the equipment is brought into operation again, not only the vaporizing chamber and the evaporizing chamber, but also the valve chambers, have to be evacuated again and this requires considerable time because of the drying-out operation that may become necessary. The charging time and therefore the productivity of the installation are thus notably reduced. Similar disadvantages also attach to the equipment disclosed in U.S. Pat. No. 3,641,973.

SUMMARY OF THE INVENTION

The object of the invention is therefore to provide a vacuum vapour-deposition installation of the initially described kind whereby the number of production cycles per unit of time can be further increased and productivity therefore raised.

According to the invention, this object is achieved in the vacuum vapour-deposition installation initially described in that the interior of the evaporizing chamber is accessible from the exterior without interrupting the vacuum in the valve chamber.

Because of the accessibility of the evaporizing chamber while the two-way valve is hermetically closed, the vacuum in the valve chamber and in the connected pump unit can be maintained, whereas cleaning of the evaporizing crucible, loading with fresh material to be evaporated, monitoring the operations and, if necessary, replacement and/or adjustment of elements of the evaporator are nevertheless possible. Elements of the evaporator that may have to be replaced or adjusted include, in the case of what are called electron-beam evaporators, those parts of the electron-beam gun subject to wear, and in particular the heavily thermally loaded cathode. After the evaporizing chamber has been closed again, its interior can be briefly evacuated again, and the entire installation is again ready to operate.

The interior of the evaporizing chamber can be rendered accessible in various ways. For example, it is possible to connect the evaporizing chamber firmly with the valve chamber, and to provide in the valve chamber an opening, e.g. a door, which can be closed in a vacuum-tight manner and through which the evaporator can be reached.

It is however, particularly advantageous to connect the evaporizing chamber in a detachable manner to the valve chamber by means of a sealing flange. Removal of the evaporizing chamber uncovers an opening which is substantially of the same cross-section as the sealing flange, so that the evaporizing chamber is easily accessible, particularly from above.

According to a further feature of the invention and for the purpose of effecting movement of the evaporizing chamber, it is proposed that this chamber be mounted to be lifted and pivoted in a hinge pin which has a vertical axis and is arranged on the lower face of the valve chamber. By means of a suitable hydraulic drive, the evaporizing chamber can be easily lowered and swung to the side, so that, given a suitable arrangement of the hinge pin in relation to the projection surface of the valve chamber, it is completely accessible from above. This is the case when the hinge pin is arranged in the immediate vicinity of the contour of the valve chamber and/or is connected to the evaporizing chamber by way of a lever-arm of suitable length.

It has been stated above that the sealing action of valves is gradually reduced by the deposition of vapour on the valve seats. According to a further feature of the invention and for the purpose of eliminating this adverse effect on the vacuum during the charging time, it is proposed that two protective rings, corresponding to the space between and the projection surface of the valve seats, be arranged in the valve chamber, which protective rings can be moved in, and in particular swung in, in front of the valve seats in alternation with the two-way valve. In this way, the valve seats are covered by the disc of the two-way valve during the charging time and by the protective rings during evaporization, so that condensation of vapour on the valve seats is practically precluded. The condensation of vapour can be completely eliminated if the protective rings, like the valve discs, can be pressed onto the valve seats.

BRIEF DESCRIPTION OF THE FIGURE

A form of construction of the article of the invention will now be described in greater detail by reference to the single attached FIGURE, which is a perspective illustration of a complete vacuum vapour-deposition installation with the vaporizing chamber and the evaporizing chamber both opened.

DETAILED DESCRIPTION OF THE INVENTION

The FIGURE shows a valve chamber 1 which takes the form of a shallow box rounded at one end. Also shown are an upper chamber wall 2, a lower chamber wall 3 and a peripheral wall 4. A high-vacuum pump 5, known per se, is secured by flanges to the lower chamber wall 3 in the rounded portion. Because of the presence of a frame 6, the valve chamber 1 is spaced from the surface on which the installation is mounted, and the space is sufficient for the purposes now to be described in detail. The space within the frame 6 is delimited at one side by a door 7. The high-vacuum pump 5 is connected to the valve chamber 1 by way of a suction opening, now shown, in which may be provided a baffle of the known kind.

Formed in the upper chamber wall 2 is an upwardly facing opening 8 which is surrounded by a cylindrical port 9 having an upper flange 10 and a lower flange 11. The lower flange 11 is vacuum-tight and is connected to the upper chamber wall 2 but is not necessarily detachable therefrom. Secured to the cylindrical port 9 is a hinge with a horizontal hinge pin 12 to which is secured a vaporizing chamber 13 which can be swung in a vertical plane and, in fact, in the direction indicated by the double-headed arrow 14. The evaporizing chamber 13 has a flange 15 which can be connected in a vacuum-tight manner to the upper flange 10 of the cylindrical port 9. Arranged within the vaporizing chamber 13 is a substrate holder 16 which serves to accomodate substrates 17 and is rotatable about the axis of symmetry of the chamber 13.

Formed in the lower chamber wall 3 is a second, downwardly facing, opening 18 which is aligned with the first opening 8 and is of substantially the same diameter as this first opening. Arranged on the lower face of the valve chamber 1, i.e. at the lower chamber wall 3, is a hinge pin 19 which has a vertical axis and on which an evaporizing chamber 20 can be raised and lowered in the direction indicated by the arrow 21, this chamber also being mounted to swing in the direction indicated by the arrow 38. The evaporizing chamber 20 has a flange 23 at its upper edge, and the position of the hinge pin 19 and the radius of swing of the axis of symmetry of the evaporizing chamber 20 are so selected that said chamber can be swung below the second opening 18. By raising the evaporizing chamber 20 by means of a pressure-medium drive, not illustrated, the flange 23 at the edge of the opening 18 can be pressed onto the lower chamber wall so that a vacuum seal is ensured.

The evaporizing chamber 20 comprises a compartment 24 in which an evaporator, an electron-beam evaporator in the present case, with an evaporator crucible 26 is arranged. Above the crucible 26 is located a shutter 27 which can be swung into the illustrated position and by means of which the stream of vapour emerging from the crucible 26 can be interrupted.

Within the valve chamber 1, both the first opening 8 and the second opening 18 are surrounded by circular valve seats 28 and 29 with which a two-way valve, horizontally movable in the valve chamber and having two valve discs 30 and 31, co-operates in such manner that the interior of the valve chamber 1 can be shut off from both the vaporizing chamber 13 and the evaporizing chamber 20 in a vacuum-tight manner. This takes place by means of a known spreader drive 32 which is arranged between the valve discs 30 and 31, only the outer casing of this drive being visible in the FIGURE. By means of this spreader drive, the two valve discs 30 and 31 can be pressed against and removed from the valve seats 28 and 29, and mutual support is thus achieved so that the reaction forces are absorbed over the shortest possible path and a complicated structure for backing the valve discs is unnecessary. The valve discs and the spreader drive can be swung about a vertical pivot 34 in the direction indicated by the arrow 33, so that a straight-through connection between the openings 8 and 18 can be established.

Also contained in the valve chamber 1 are two protective rings 35 and 36 which are disposed parallel with each other and whose vertical spacing, related to the upper delimiting surface of the protective ring 35 and the lower delimiting surface of the protective ring 36, corresponds substantially to the space between the valve seats 28 and 29. The cross-section of the protective rings likewise corresponds to the cross-section of the valve seats, so that, in the retracted position of the valve seats 28 and 29, the protective rings afford protection against undesirable vaporization. The protective rings 35 and 36 are jointly retracted by means of a swinging movement in the direction indicated by the arrow 37 and, in fact, about a pivot which is masked in the drawing by the vaporizing chamber 13. The valve discs 30 and 31 and the protective rings 35 and 36 are moved alternately in each case, and mutual interference is avoided by a coupling of the drive.

The mode of operation of the equipment is as follows. It is assumed that the installation has completed at least one work cycle. The openings 8 and 18 are closed in a vacuum-tight manner in the illustrated position by means of the valve discs 30 and 31, so that the interior of the valve chamber 1 and the high-vacuum pump 5 are under high vacuum. In this case the protective rings 35 and 36 are out to the side, as also illustrated. The vaporizing chamber 13 is in the open position as illustrated, so that the coated substrates 17, located in the substrate holder 16, can be replaced by uncoated substrates. The vaporizing chamber 13 is then swung in the direction indicated by the double-headed arrow 14 until it bears against the upper flange 10 so that a vacuum-tight connection is established. The interior of the vaporizing chamber 13 is initially still under atmospheric pressure. The evaporizing chamber 20 will also have been recharged and the evaporizer 15 examined so that it can be swung below the opening 18 in the direction indicated by the arrow 38. After the evaporizing chamber has been lifted towards the lower chamber wall 3, a vacuum-tight connection is also present here. The interior of the vaporizing chamber 20 is likewise first under atmospheric pressure.

The vaporizing chamber 13 and the evaporizing chamber 20 are then likewise evacuated; this can be done either by way of additional ducts, not illustrated, or simply by releasing the spreader drive 32 so that the valve discs lift from the valve seats. Then, the valve discs 30 and 31 are swung in unison in the direction indicated by the arrow 33, so that a straight-through connection between the evaporizing crucible 20 and the substrate holder 16 is established. The protective rings 35 and 36 are swung in in front of the valve seats 28 and 29 respectively, and the installation is ready for operation. Then, as soon as material has evaporated from the crucible 26, it condenses on a substrate 17 and leads to the formation of thin coatings. Upon completion of the vapour-deposition process, the progress of which is determined by the required properties of the coating, the protective rings 35 and 36 are moved back into the illustrated position, and the valve discs 30 and 31 are likewise moved into the illustrated position and pressed against the valve seats 18 and 29. The vaporizing chamber 13 and the evaporizing chamber 20 can then be flushed, whereupon the charging, etc., cycle is repeated.

What is claimed is:

1. In a vacuum vapour-deposition installation for batch-wise operation having a valve chamber with a suction opening for producing a vacuum, an upward directed first opening for vacuum-tight connection with a removable vaporizing chamber, and a downwardly directed second opening for connection with an evaporizing chamber, the first and the second openings being substantially in alignment and each being surrounded by a valve seat towards the valve chamber and a two-way valve which is horizontally movable in the valve chamber with two valve discs which can be moved apart, the improvement comprising means permitting access to the interior of the evaporizing chamber from the exterior without interrupting the vacuum in the valve chamber.

2. A vacuum vapour-deposition installation according to claim 1, wherein the access means comprises means removably connecting the evaporizing chamber to the valve chamber comprising a sealing flange.

3. A vacuum vapor-deposition installation according to claim 2, wherein the access means comprises means mounting the evaporizing chamber for vertical and pivotal horizontal movement about a vertical pivot axis disposed on the lower face of the valve chamber.

4. A vacuum vapour-deposition installation according to claim 1, further comprising two protective rings disposed in the valve chamber and corresponding in size to the space between and the projection surface of the valve seats and mounted for movement in front of the valve seats in alternation with the two-way valve.

* * * * *